US00RE39988E

(19) United States
(12) Reissued Patent
Wickboldt et al.

(10) Patent Number: US RE39,988 E
(45) Date of Reissued Patent: Jan. 1, 2008

(54) DEPOSITION OF DOPANT IMPURITIES AND PULSED ENERGY DRIVE-IN

(75) Inventors: Paul Wickboldt, Walnut Creek, CA (US); Paul G. Carey, Mountain View, CA (US); Patrick M. Smith, San Jose, CA (US); Albert R. Ellingboe, Malahide (IE)

(73) Assignee: The Regents of the University of California, Oakland, CA (US)

(21) Appl. No.: 10/768,656

(22) Filed: Jun. 29, 2001

Related U.S. Patent Documents

Reissue of:
(64) Patent No.: 5,918,140
Issued: Jun. 29, 1999
Appl. No.: 08/876,414
Filed: Jun. 16, 1997

(51) Int. Cl.
*H01L 21/26* (2006.01)
*H01L 21/42* (2006.01)
*H01L 21/22* (2006.01)
*H01L 21/38* (2006.01)

(52) U.S. Cl. ..... 438/535; 438/557; 438/558
(58) Field of Classification Search ..... 438/535, 438/557, 558, 550, 89
See application file for complete search history.

(56) References Cited

U.S. PATENT DOCUMENTS 4,147,563 A * 4/1979 Narayan et al. ..... 438/89
4,273,950 A * 6/1981 Chitre ..... 136/255
4,382,099 A * 5/1983 Legge et al. ..... 438/57
4,452,644 A * 6/1984 Bruel et al. ..... 438/536
4,824,489 A * 4/1989 Cogan et al. ..... 136/256
5,316,969 A * 5/1994 Ishida et al. ..... 438/535
5,817,550 A * 10/1998 Carey et al. ..... 438/166

OTHER PUBLICATIONS

Jeff Hecht, Understanding Lasers, An Entry–Level Guide, Second Edition, IEE Press, 1993, pp. 214, 226–228, 411.*

* cited by examiner

*Primary Examiner*—Carl Whitehead, Jr.
*Assistant Examiner*—Heather Doty
(74) *Attorney, Agent, or Firm*—John H. Lee; Michael C. Staggs

(57) ABSTRACT

A semiconductor doping process which enhances the dopant incorporation achievable using the Gas Immersion Laser Doping (GILD) technique. The enhanced doping is achieved by first depositing a thin layer of dopant atoms on a semiconductor surface followed by exposure to one or more pulses from either a laser or an ion-beam which melt a portion of the semiconductor to a desired depth, thus causing the dopant atoms to be incorporated into the molten region. After the molten region recrystallizes the dopant atoms are electrically active. The dopant atoms are deposited by plasma enhanced chemical vapor deposition (PECVD) or other known deposition techniques.

33 Claims, 1 Drawing Sheet

DEPOSITION OF DOPANT IMPURITIES AND PULSED ENERGY DRIVE-IN

Matter enclosed in heavy brackets [ ] appears in the original patent but forms no part of this reissue specification; matter printed in italics indicates the additions made by reissue.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the incorporation of dopant impurities, particularly to depositing dopant impurities in the surface of a semiconductor, and more particularly to an enhanced doping process involving deposition of a dopant on the semiconductor surface followed by melting of the surface and drive-in of the dopant using pulsed energy to be absorbed near the surface.

Various techniques have been developed for incorporating a dopant into a material. One of these techniques is known as Gas Immersion Laser Doping (GILD). This GILD technique involves irradiating a material, such as a semiconductor surface, with a pulsed laser in the presence of a dopant ambient (such as $BF_3$, $PF_5$, $AsH_3$, etc.). The GILD process relies on the dopant molecules adsorbing on the semiconductor surface, the laser pulse melting a surface region of the semiconductor, the dopant being incorporated into the molten region of the semiconductor, and the molten region solidifying after the laser pulse, the dopant atoms being electrically active after solidification of the semiconductor. Using the GILD technique, the maximum dose of electrically active dopant atoms per pulse is limited to a fraction of the adsorbed dopant molecules (about $10^{13}$ $cm^{-2}$). Useful dopant doses are above $5\times10^{14}$ $cm^{-2}$. Thus, the GILD technique requires at least 50 doping pulses for practical use.

The present invention involves a semiconductor doping process which enhances the dopant incorporation achieved using the GILD technique. The doping process of the present invention enhances the doping per pulse by increasing the surface concentration (and possibly thickness) of dopant molecules on the semiconductor surface prior to an energy pulse, thus resulting in a greater dose of dopant per pulse. Thus, by the two-step process of the invention involving: 1) dopant deposition onto a semiconductor surface, and 2) dopant incorporation in the semiconductor by pulsed laser or pulsed ion beam energy, the number of pulses required to achieve useful active dopant concentrations is significantly reduced compared to the GILD technique. The deposition of the dopant on the semiconductor surface can be accomplished by a number of known deposition techniques. The energy pulse may be either that of a pulsed laser or of a pulsed ion-beam source.

SUMMARY OF THE INVENTION

It is an object of the present invention to provide a process for the incorporation of dopant impurities in a material.

A further object of the invention is to provide a doping process which enhances manufacturability of pulsed laser-based semiconductor doping and junction formation.

A further object of the invention is to provide a doping process which enhances manufacturability of pulsed ion-beam semiconductor doping and junction formation.

A further object of the invention is to provide a process which enhances the dopant incorporation in a semiconductor.

A further object of the invention is to provide a semiconductor doping process which involves deposition of a dopant on a surface of a semiconductor and drive-in of the dopant into the semiconductor by either a pulsed-laser or a pulsed-ion-beam.

Another object of the invention is to provide a semiconductor doping process which enhances the dopant incorporation achievable using the Gas Immersion Laser Doping (GILD) technique.

Another object of the invention is to provide a doping process which enhances the dopant incorporation achievable using pulsed ion-beam doping techniques.

Another object of the invention is to provide a doping process which involves depositing a layer of dopant atoms on a surface of a material to be doped, followed by exposure to one or more energy pulses (either laser or ion-beam) which melt the surface thus causing the dopant to be incorporated into the molten region.

Another object of the invention is to provide a two-step doping process involving deposition of a dopant on a surface of a material, and melting of the surface using pulsed energy (supplied by either a laser or an ion-beam), whereby the dopant is diffused into the surface of the material.

Another object of the invention is to provide a doping process utilizing pulsed laser or pulsed ion-beam processing of a dopant deposited on a semiconductor surface thereby resulting in a greater dose of dopant per energy pulse than the dopant dose produced the Gas Immersion Laser Doping technique.

Other objects and advantages of the present invention will become apparent from the following description and accompanying drawings. The invention is basically a two-step process for incorporating electrically active dopant atoms into a material, such as a semiconductor, and involves the deposition of dopant impurities on a material surface, and pulsed laser or pulsed ion-beam drive-in of the dopant into the material surface. The deposition of the dopant can be carried out using techniques including plasma enhanced chemical vapor deposition (PECVD), also known as glow discharge CVD, sputtering, condensation through cooling the material to be doped, thermal decomposition CVD (such as LPCVD or hot-wire CVD), and photolytic decomposition. The pulsed energy drive-in of the dopant can be carried out, for example, using a 308 nm wavelength XeCl excimer laser with a pulse duration or length of 40 ns (below 1 ms) and energy density of 600 mJ $cm^{-2}$. The first half of the doping process of the present invention enhances the dopant incorporation achieved using the gas immersion laser doping (GILD) technique. The maximum dose of electrically active dopant atoms per laser pulse produced by the GILD technique is limited to a fraction of the adsorbed molecules (approximately $10^{13}$ $cm^{-2}$), with required dopant concentration typically being much higher (for example a minimum of $5\times10^{14}$ $cm^{-2}$) for a source/drain junction in FET type devices, while the dopant dose per pulse of the present invention is greater than $10^{15}$ $cm^{-2}$. Thus, while the GILD technique requires at least 50 doping pulses for practical use, the present invention requires only a few (1 to 10) pulses, thus greatly reducing the required number of pulses and improving the throughput of the doping process.

BRIEF DESCRIPTION OF THE DRAWINGS

The accompanying drawings, which are incorporated into and form a part of the disclosure, illustrate an embodiment of the process of the invention and, together with the description, serve to explain the principles of the invention.

DETAILED DESCRIPTION OF THE INVENTION

The present invention is directed to a doping process which enhances the dopant incorporation into a material, such as a semiconductor, achievable using doping techniques involving surface melting such as the gas immersion laser doping (GILD) technique. The doping process of this invention is a two-step process for incorporating, for example, an electrically active dopant into a semiconductor. However, the process can be utilized to effectively dope materials for other applications. Because the doping process of this invention reduces the number of energy pulses required to achieve useful active dopant concentrations, compared to the number of energy pulses required using the GILD technique, the present invention will supersede and possibly replace the current GILD technique. As pointed out above, when using the GILD technique the maximum dose of electrically active dopant atoms per energy pulse is limited to a fraction of the adsorbed molecules (about $10^{13}$ $cm^{-2}$). Useful dopant doses are above $5\times10^{14}$ $cm^{-2}$, and thus the GILD technique requires at least 50 doping pulses for practical use. Using the two-step process of this invention which enhances the dopant surface concentration followed with an energy pulse to incorporate the dopant into the semiconductor, the number of pulses is reduced to a few (1-10) to achieve useful active dopant concentrations. This enhances the manufacturability of pulsed laser and pulsed ion-beam semiconductor doping and junction formation by reducing the required number of energy pulses by a factor of 10.

The invention involves a combination of dopant deposition followed by pulsed laser or ion-beam dopant drive-in. By the process of this invention doping is enhanced by increasing the surface concentration (and possibly thickness) of dopant molecules on the semiconductor surface prior to the energy pulse, thus resulting in a greater dose of dopant per pulse. The first step is to deposit a layer of dopant molecules/atoms on the surface of the semiconductor. The second step is to use either a laser or ion-beam pulse to melt the surface region on the semiconductor. During the molten phase, the dopant molecules/atoms diffuse into the molten region of the semiconductor. Following solidification of the molten region, dopant atoms are frozen into the semiconductor (i.e., incorporated onto lattice sites) and are electrically active.

Figure 1:
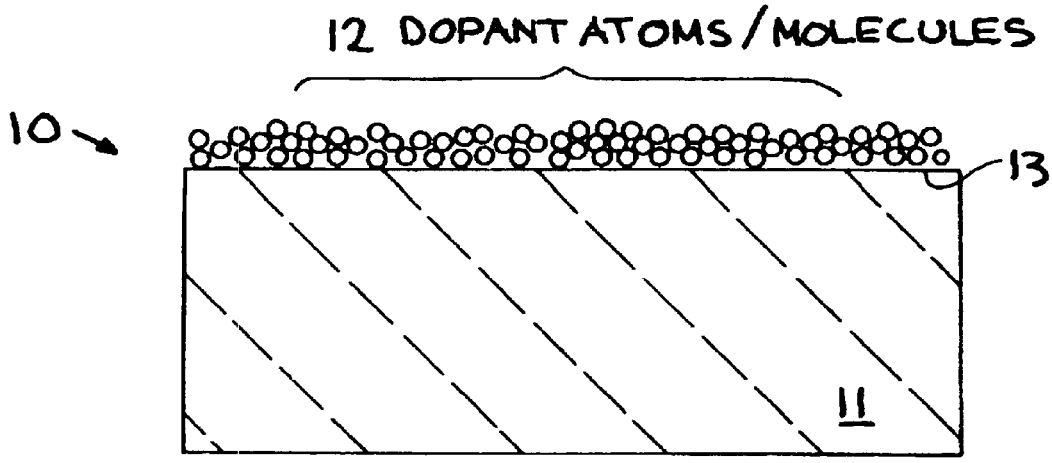
FIG. 1 illustrates schematically the dopant deposition operation of the process carried out in accordance with the invention.
Figure 2:
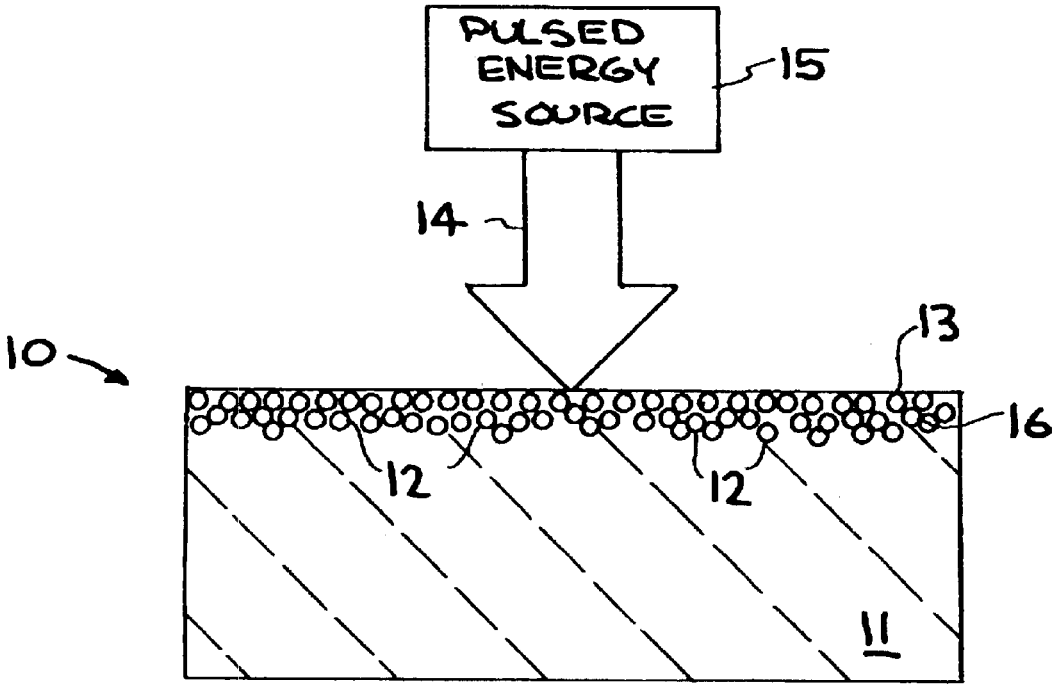
FIG. 2 illustrates schematically the dopant incorporation following the pulsed laser or ion-beam processing carried out in accordance with the invention.

The two-step doping process is described hereinafter with reference to FIGS. 1 and 2, wherein FIG. 1 illustrates the first step of the process, namely, dopant deposition onto a semiconductor surface; and FIG. 2 illustrates the second step of the process; namely, dopant incorporation into the semiconductor by pulsed laser or ion-beam processing. The two-step process increases surface concentration of dopant atoms/molecules compared to prior processes.

For the first step of the process (dopant deposition on a surface of a semiconductor), as seen in FIG. 1, a variety of deposition techniques may be used, such as plasma enhanced chemical vapor deposition (PECVD) also known as glow discharge CVD, sputtering, condensation through cooling the semiconductor, thermal decomposition CVD (such as LPCVD or hot-wire CVD), and photolytic decomposition. In PECVD a dopant gas, such as $BF_3$, $PF_5$, $AsH_3$, $B_2H_6$, $AsF_5$, or $PH_3$, or an appropriate organometallic, is introduced into a glow discharge which decomposes the gas into chemical active radicals. These radicals attach to the semiconductor surface and form the dopant layer. By way of example, a glow discharge may be used to decompose $PF_5$ to deposit a layer of phosphorus atoms/molecules 12 on the surface 13 of {100} silicon 11 of a semiconductor 10, as seen in FIG. 1. This could be done by, for example, introducing 0.1 standard cubic centimeters of $PF_5$ into a glow discharge of He operating at a pressure of 300 nTorr. With 30% conversion efficiency over an area of 1000 $cm^2$, this would result in a layer of phosphorus atoms 12 with a surface density of approximately $8\times10^{14}$ atoms/$cm^2$. This surface density is more than an order of magnitude greater compared to that achieved by surface adsorption in the GILD technique, and can be easily increased by introducing more $PF_5$. For sputtering, a standard sputtering technique is used to sputter a target containing the desired dopant to deposit a thin layer of the dopant. For example, magnetron sputtering is a well known technique as exemplified by U.S. Pat. No. 5,203,977 and U.S. Pat. No. 5,232,571. Deposition by condensation is also a well known technique and is implemented by cooling the semiconductor in the presence of a dopant ambient (atmosphere), where the dopant layer is the condensant. Thermal decomposition CVD is a widely used technique for the desposition of thin films. For example, low pressure CVD (or LPCVD) is often used to thermally decompose SiHg or Si2H6 gases to form thin films of silicon, and similar techniques could be used to form dopant layers using a dopant source gas (e.g., $B_2H_6$, $AsH_3$, $PF_5$, etc.). Photolytic decomposition is a CVD technique in which a dopant source gas is photolytically decomposed by an appropriate light source (e.g., UV lamp, excimer laser, etc.).

For the second step (dopant incorporation or dopant drive-in), the dopant layer of phosphorus atoms 12 shown in FIG. 1 is incorporated or driven into, for example the semiconductor silicon 11, below the surface 13 upon exposure thereto of a pulse of laser or ion-beam energy or laser beam 14 from a source 15, such as, for example, an XeCl excimer laser, having a wavelength of 308 nm. The energy is absorbed in the silicon/dopant layer surface region and converted to thermal energy which melts an upper region of the silicon 11, as indicated at 16, and converts this region to crystalline polysilicon. During the time the silicon region 16 is molten, dopant atoms 12 diffuse rapidly into the silicon as a result of their higher diffusivity. Upon solidification of the silicon region 16, the dopant atoms are incorporated into the polysilicon region 16, as indicated at 17, in the correct lattice positions to be electrically active sites.

By way of example, an XeCl excimer laser, operating at a wavelength of 308 nm, produces an energy pulse in the range of 50 to 1000 mJ $cm^{-2}$, (millijoules per $cm^2$) with a pulse length of 5 to 100 ns, whereby a dose of about $8\times10^{14}$ $cm^{-2}$ electrically active dopant atoms per laser pulse is produced. The thickness or depth of the converted polysilicon region 16 is dependent on the energy density and length of the energy pulse(s). Other types of pulsed laser systems may be utilized to produce the desired pulse length and energy density, such may include other types of excimer lasers (e.g. XeF or KF), copper vapor lasers, dye lasers, and pulsed NdYAG lasers. Also, the pulsed energy density can be produced by existing pulsed ion-beam machines.

If the pulsed energy is produced by a laser system, such as exemplified above, a variety of laser wavelengths may be used so long as the wavelength is short enough, whereby the laser energy is absorbed in the near surface region of the silicon, for example. The pulsed duration and energy density can be varied to control the depth of melt, and in turn, the depth of dopant incorporation.

It would also be possible to use a pulsed ion beam instead of a pulsed laser beam to deliver energy to the near surface region of the material to be doped. Again, the pulse energy density and duration could be varied to control the depth of melt and doping.

The enhanced doping, made possible by the process of the present invention, will make possible the manufacture of: 1) active matrix flat panel displays on plastic substrates; and 2) shallow junction formation for microelectronics on silicon, insulating or plastic substrates. Other uses include potential enabling technology for large area low cost electronics (such as flat panel displays), portable electronics, and ultra-submicron (deep submicron) semiconductor device fabrication. Also, by the use of this doping process, flexible displays are envisioned for use in field-deployable portable electronics, battlefield operations facilities, and the interiors of ships, tanks and aircraft. In addition, flexible detector arrays are envisioned for use in radiation (x-ray, gamma ray) detection. Also, shallow junction formation is critical for development use in future supercomputers.

It has thus been shown that the doping process of the present invention enhances the dopant incorporation achievable using the GILD technology, and a greater dose of electrically active dopant atoms per laser pulse is produced compared to the GILD technique. The doping process of this invention thus significantly reduces the number of doping pulses require to produce useful dopant doses of above $5\times10^{14}$ $cm^{-2}$, thereby enhancing the manufacturability of pulsed laser-based as well as pulsed ion-beam-based semiconductor doping and junction formation.

While a specific operational sequence, deposition techniques, pulsed energy sources, materials, parameters, etc., have been set forth to exemplify and describe the principles of the invention, such are not intended to be limiting. Modifications and changes may become apparent to those skilled in the art, and it is intended that the invention be limited only by the scope of the appended claims.

The invention claimed is:

1. A doping process consisting of:

depositing dopant on a surface of a material to be doped using a dopant atmosphere selected from the group consisting of [$BF_2$] *$BF_3$*, $PF_5$, $AsH_3$, $B_2H_6$, $PH_3$, $AsF_5$, and organometallics; and incorporating the dopant into the material by pulsed energy processing using pulsed energy selected from the group consisting of pulsed laser energy and pulsed ion-beam energy to produce a dose of about $10^{15}$ $cm^{-2}$ electrically active dopant atoms per energy pulse.

2. The process of claim 1, wherein depositing the dopant is carried out by a technique selected from the group consisting of plasma enhanced chemical vapor deposition, sputtering, condensation through cooling the material to be doped, thermal decomposition CVD, and photolytic decomposition.

3. The process of claim 1, wherein the pulsed laser energy is provided by a laser selected from the group consisting of excimer lasers, copper vapor lasers, dye lasers, and pulsed NdYAG lasers.

4. The process of claim 3, wherein the pulsed laser energy is produced by an XeCl excimer laser.

5. The process of claim 4, wherein the pulsed excimer laser is constructed to operate at a wavelength of 308 nm, and controlling the excimer laser to produce 1 to about 10 pulses with an energy pulse of 50 to 1000 mj $cm^{-2}$, and with a pulse length of 5 to 100 ns.

6. An improved semiconductor doping process comprising:

depositing a layer of dopant atoms/molecules on a surface of a semiconductor in an atmosphere selected from the group consisting of $BF_3$, $PF_5$, $AsH_3$, $B_2H_6$, $PH_3$, $AsF_5$, $PH_3$, and organometallics, followed by exposure to one or more energy pulses using a pulsed ion-beam machine or a pulsed laser supplied with a wavelength such that the energy is absorbed in the near surface region of the semiconductor which melts a portion of the semiconductor, forming a molten region thereby causing the dopant atoms/molecules to be incorporated into the molten region at a dose rate of about $10^{15}$ $cm^{-2}$ per energy pulse; and allowing the molten region to recrystallize whereby the dopant atoms/molecules are electrically active in the semiconductor.

7. The process of claim 6, wherein depositing the layer of dopant atoms/molecules is carried out by a technique selected from the group consisting of PECVD, glow discharge CVD, sputtering, condensation, photolytic decomposition, and thermal decomposition CVD.

8. The process of claim 6, additionally including forming the one or more energy pulses using a pulsed laser selected from the group consisting of excimer lasers, copper vapor lasers, dye lasers, and pulsed NdYAG lasers.

9. The process of claim 6, wherein the one or more energy pulses have a pulse duration of less than 1 ms.

10. The process of claim 6, wherein the one or more energy pulses are produced by an XeCl excimer laser.

11. The process of claims 6, additionally including forming the semiconductor from at least a layer of silicon.

12. The process of claim 11, wherein the molten region recrystallizes as doped polysilicon.

13. In a process for doping a semiconductor material using pulsed laser energy or pulsed ion-beam energy processing, the improvement comprising:

forming a layer of dopant atoms on a surface of the semiconductor material from the group consisting of $BF_3$, $PF_5$, $AsH_3$, $B_2H_6$, $PH_3$, $AsF_5$, and organometallics prior to pulsed energy processing to produce a dopant dose rate of about $10^{15}$ $cm^{-2}$ electrically active dopant atoms per energy pulse.

14. The improvement of claim 13, additionally including forming the dopant atoms from a material which is electrically active following the pulsed energy processing, and wherein forming of the layer of dopant atoms is carried out such that a dose of electrically active dopant atoms formed from a layer of dopant atoms per energy pulse is about $10^2$ $cm^{-2}$ greater than a dose of dopant atoms formed by pulsed energy processing in the presence of a dopant atmosphere.

15. The improvement of claim 13, wherein the pulsed energy processing is carried out using one or more pulses from an excimer laser or an ion beam machine.

*16. A method for forming a doped polycrystalline semiconductor, comprising:*

*depositing a dopant onto a surface of a semiconductor,*

*exposing the surface of the semiconductor in the presence of a dopant atmosphere to at least one energy pulse to melt a portion of the semiconductor adjacent the surface, wherein a dose of $10^{14}$ $cm^{-2}$ or greater electrically active dopant atoms per energy pulse is incorporated into the melted portion; and*

*allowing the melted portion of the semiconductor to solidify to form a polycrystalline semiconductor con-*

*taining the incorporated dopant in the polycrystalline semiconductor in correct lattice positions to be electrically active sites.*

*17. A method for forming a doped polycrystalline semiconductor, comprising:*

*depositing a dopant onto a surface of a semiconductor using a dopant atmosphere selected from the group consisting of $BF_3$, $PF_5$, $AsH_3$, $B_2H_6$, $PH_3$, $AsF_5$, and organometallics;*

*exposing the surface of the semiconductor to at least one energy pulse to melt a portion of the semiconductor adjacent the surface, wherein a dose of $10^{14}$ $cm^{-2}$ or greater electrically active dopant atoms per energy pulse is incorporated into the melted portion; and*

*allowing the melted portion of the semiconductor to solidify to form a polycrystalline semiconductor containing the incorporated dopant in the polycrystalline semiconductor in correct lattice positions to be electrically active sites.*

*18. The method of claim 16 wherein depositing the dopant employs a technique selected from the group consisting of plasma enhanced chemical vapor deposition, sputtering, condensation through cooling the material to be doped, thermal decomposition CVD, and photolytic decomposition.*

*19. The method of claim 16 wherein depositing the dopant employs plasma enhanced chemical vapor deposition.*

*20. The method of claim 16 wherein the energy pulse is selected from the group consisting of pulsed laser energy and pulsed ion-beam energy.*

*21. The method of claim 16 wherein the energy pulse is pulsed laser energy.*

*22. The method of claim 21 wherein the pulsed laser energy is provided by a laser selected from the group consisting of an excimer laser, a copper vapor laser, a dye laser, and a pulsed NdYAG laser.*

*23. The method of claim 16 wherein the at energy pulse is produced by an excimer laser.*

*24. The method of claim 23 wherein the excimer laser is comprises at least one excimer selected from a XeCl, XeF, and KF excimer laser.*

*25. The method of claim 23 wherein the excimer laser is operated at a wavelength of 308 nm, and is controlled to produce a number of pulses in the range 1 pulse to 10 pulses with a pulse length in the range 5 ns to 100 ns with a pulse energy in the range 50 mJ $cm^{-2}$ to 1000 mJ $cm^{-2}$.*

*26. The method of claim 17 wherein depositing the dopant employs a technique selected from the group consisting of plasma enhanced chemical vapor deposition, sputtering, condensation through cooling the material to be doped, thermal decomposition CVD, and photolytic decomposition.*

*27. The method of claim 17 wherein depositing the dopant employs plasma enhanced chemical vapor deposition.*

*28. The method of claim 17 wherein the energy pulse is selected from the group consisting of pulsed laser energy and pulsed ion-beam energy.*

*29. The method of claim 17 wherein the energy pulse is pulsed laser energy.*

*30. The method of claim 29 wherein the pulsed laser energy is provided by a laser selected from the group consisting of an excimer laser, a copper vapor laser, a dye laser, and a pulsed NdYAG laser.*

*31. The method of claim 17 wherein the energy pulse is produced by an excimer laser.*

*32. The method of claim 31 wherein the excimer laser comprises at least one excimer selected from a XeCl, XeF, and KF excimer laser.*

*33. The method of claim 31 wherein the excimer laser is operated at a wavelength of 308 nm, and is controlled to produce a number of pulses in the range 1 pulse to 10 pulses with a pulse length in the range 5 ns to 100 ns with a pulse energy in the range 50 mJ $cm^{-2}$ to 1000 mJ $cm^{-2}$.*

* * * * *